United States Patent [19]
Marcum

[11] Patent Number: 5,473,309
[45] Date of Patent: Dec. 5, 1995

[54] APPARATUS FOR TESTING AN IRRIGATION SYSTEM CONTROLLER AND METHOD OF TESTING IRRIGATION SYSTEMS

[76] Inventor: Dale H. Marcum, 2716 New Hartford Rd., Owensboro, Ky. 42303

[21] Appl. No.: 186,565

[22] Filed: Jan. 26, 1994

[51] Int. Cl.$^6$ .................................................... G08B 29/00
[52] U.S. Cl. ........................ 340/514; 340/515; 340/518; 340/508; 364/145; 364/146; 364/188; 364/420; 364/510; 137/551; 137/624.2; 137/624.18
[58] Field of Search .................................... 340/514, 515, 340/518, 505, 501, 825.54, 825.06; 364/138, 139, 140, 141, 144, 145, 188, 143, 420, 506, 510, 146; 137/551, 624.2, 624.11, 624.18

[56] References Cited

U.S. PATENT DOCUMENTS

| | | |
|---|---|---|
| 3,955,183 | 5/1976 | McBrian . |
| 4,206,449 | 6/1980 | Galvin et al. . |
| 4,214,227 | 7/1980 | Papasideris . |
| 4,223,306 | 9/1980 | Reimer . |
| 4,274,087 | 6/1981 | Swanson et al. . |
| 4,329,643 | 5/1982 | Neumann et al. . |
| 4,414,539 | 11/1983 | Armer . |
| 4,625,198 | 11/1986 | Williamson et al. . |
| 4,739,326 | 4/1986 | Anderson et al. . |
| 4,859,932 | 8/1989 | Whitley . |
| 4,937,732 | 6/1990 | Brundisini .............................. 364/145 |
| 4,937,746 | 6/1990 | Brundisini . |
| 4,970,510 | 11/1990 | Stelling . |
| 5,038,268 | 8/1991 | Krause et al. .......................... 364/145 |

FOREIGN PATENT DOCUMENTS

1556774 11/1979 United Kingdom .

Primary Examiner—Donnie L. Crosland
Attorney, Agent, or Firm—Richard C. Litman

[57] ABSTRACT

An apparatus for testing the operation of an irrigation system is disclosed. The apparatus pinpoints defects in the irrigation system controller by simulating control signals and processing the control signals through controller output chips. Visual indicators offer an indication of defects in output chips. The apparatus may be coupled to the controller and receives potential from the controller. The potential is converted to produce a signal for operating the tester. An oscillator/clocking section produces serial data input, strobe pulse, and clock pulse signals to simulate signals produced by the controller microprocessor. These signals operate the visual indicators and are simultaneously processed through the controller output chips. Defects low in the output chips prevent the operation of visual indicators. The absence of an operating visual indicator represents a defect in the output chips. A method is prescribed for testing the controller output chips for defects and replacing defective output chips, and for pinpointing defects in solenoid valve networks and controller triacs. The tester allows a user to test the irrigation system from the location of the controller and enables the user to check all of the outputs of a controller simultaneously while eliminating the need for individually checking each station terminal and its respective solenoid valve.

16 Claims, 5 Drawing Sheets

APPARATUS FOR TESTING AN IRRIGATION SYSTEM CONTROLLER AND METHOD OF TESTING IRRIGATION SYSTEMS

BACKGROUND OF THE INVENTION

1. Field of the Invention

The present invention relates to an apparatus for testing an irrigation system and, more particularly, a portable apparatus for testing an irrigation system controller.

2. Description of the Prior Art

Irrigation systems supply water by artificial means to one or more remote locations. Water is distributed from a water supply through a plumbing network comprising one or more sprinklers. Water flow through the plumbing network is controlled through the operation of a valve. Water flow through each individual sprinkler may be controlled independently through the operation of a respective independent valve.

In an electronic irrigation system, solenoid valve networks control water flow through the sprinklers. The solenoid valve network may include a plurality of solenoid valves controlled by a controller, such as the controller shown and described in U.S. Pat. No. 4,937,746, issued Jun. 26, 1990 to Andrea Brundisini. Controllers may be programmable to selectively pass signals through a solenoid valve wiring network to actuate select solenoid valves independently and as desired. Irrigation system controllers can be complicated and failures can be difficult to pinpoint. A defect in an irrigation system can reside in the controller, in the solenoid wiring network, and/or in one or more of the solenoids.

A portable apparatus for quickly and efficiently pinpointing failures in an electronic irrigation system is needed. Portable circuit testing apparatuses have been the subject of earlier patents. For example, U.S. Pat. No. 4,859,932, issued Aug. 22, 1989 to William E. Whitley, discloses a portable tester for testing continuity and detecting various types of voltages. The tester is controlled by a switch and includes an LED indicator for indicating the presence and polarity of voltage.

Devices to detect circuit failures are known. For example, U.S. Pat. No. 4,274,087, issued Jun. 16, 1981 to Dan E. Swanson, discloses a monitoring device including a housing having a face plate for supporting a test switch and a plurality of light emitting diodes. The device is operates on 6 VDC source. The light emitting diodes detect malfunctioning switches. A malfunctioning switch causes a light emitting diode downstream to remain extinguished when the test switch is closed. Once the faulty switch is isolated, it may be repaired or replaced.

Another testing apparatus is disclosed in British Patent No. GB 1 556 774, published Nov. 29, 1979 to Susumu Yoshida et al. Yoshida et al. disclose a testing apparatus for testing an electric circuit comprising a display panel, at least one indicating lamp, an actuating circuit member, and a connecting member for electrically connecting the actuating member to an electrical circuit to be tested.

None of the above inventions and patents, taken either singly or in combination, is seen to describe the instant invention as claimed.

SUMMARY OF THE INVENTION

The present invention is a tester for testing the operation of an electronically controlled irrigation system. The tester pinpoints defects in the irrigation system controller by simulating control signals and processing the simulated control signals through the controller output chips. The plurality of visual indicators offer a visual indication of the presence of a defect in the controller output chips.

The tester may be coupled to the controller through the controller's remote RF connector and receives its potential from the controller's 24 VAC power supply. The 24 VAC signal is processed through a power supply section of the tester to produce a signal for an oscillator/clocking section, the visual indicators, and a re-amplifier section.

The control signals produced by the oscillator/clocking section simulate the serial data input signal, the strobe pulse, and the clock pulse produced by the controller microprocessor. These control signals operate the visual indicators and are further passed through the re-amplifier section prior to being processed through the controller output chips. Defects in the controller output chips can lower the amplitude of the control signal produced by the oscillator/clocking section to prevent the operation of one or more respective visual indicators and bypass the re-amplifier section. The absence of an illuminated visual indicator represents a defect in one or more of the output chips.

A method is prescribed comprising steps for testing the controller output chips for defects; replacing defective output chips; pinpointing defects in solenoid valve networks; and pinpointing defective controller triacs.

The tester allows a user to test the irrigation system from the location of the controller. The tester further enables the user to check all of the outputs of a controller manually and simultaneously, while eliminating the need for individually checking each station terminal and its respective solenoid valve.

Accordingly, it is a principal object of the invention to provide an apparatus for testing an irrigation system from the location of the irrigation system controller, while eliminating the need for individually checking each station terminal and its respective solenoid valve.

It is another object that the apparatus receive potential from the controller power supply and convert that potential to provide a power supply for operating the apparatus.

It is a further object that the apparatus be configured to simulate the control signals produced by the irrigation controller.

Still another object is that the apparatus enable the user to check the controller output chips for defects; replace defective output chips; pinpoint defects in solenoid valves and their respective wiring; and pinpoint defective controller triacs.

It is an object of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENT

Figure 1:
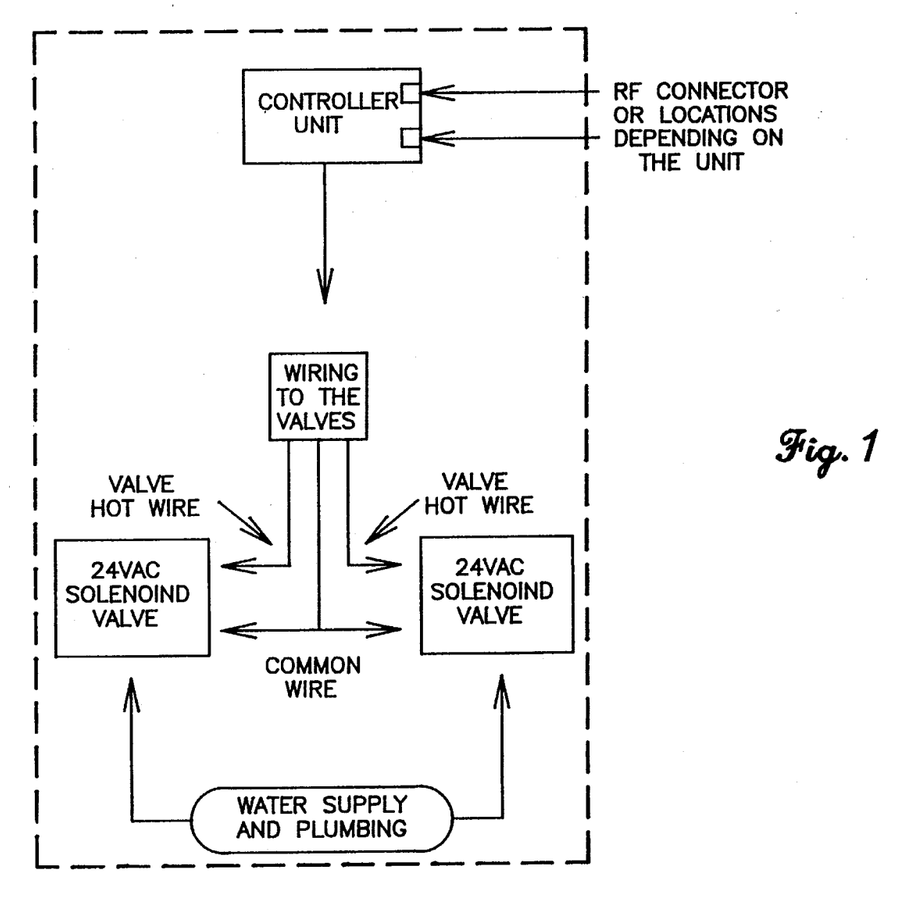
FIG. 1 is a block diagram representing an irrigation system.
Figure 4:
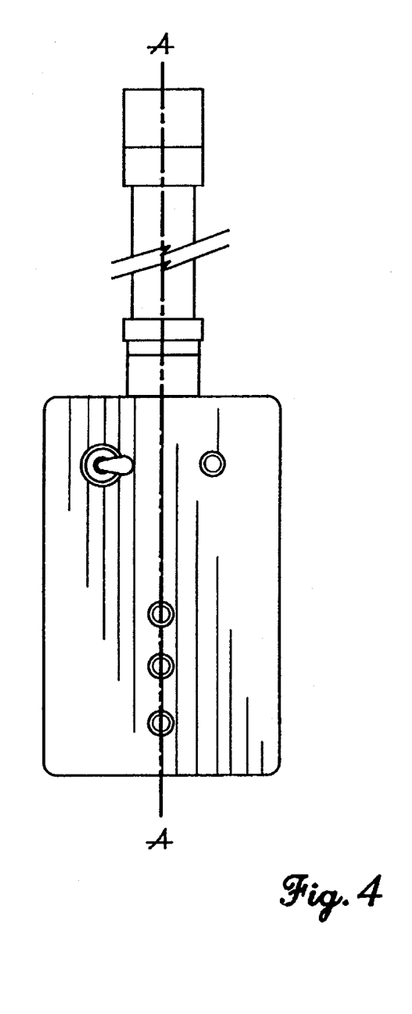
FIG. 4 is a front elevation of an apparatus according to the present invention for testing an irrigation system.
Figure 5:
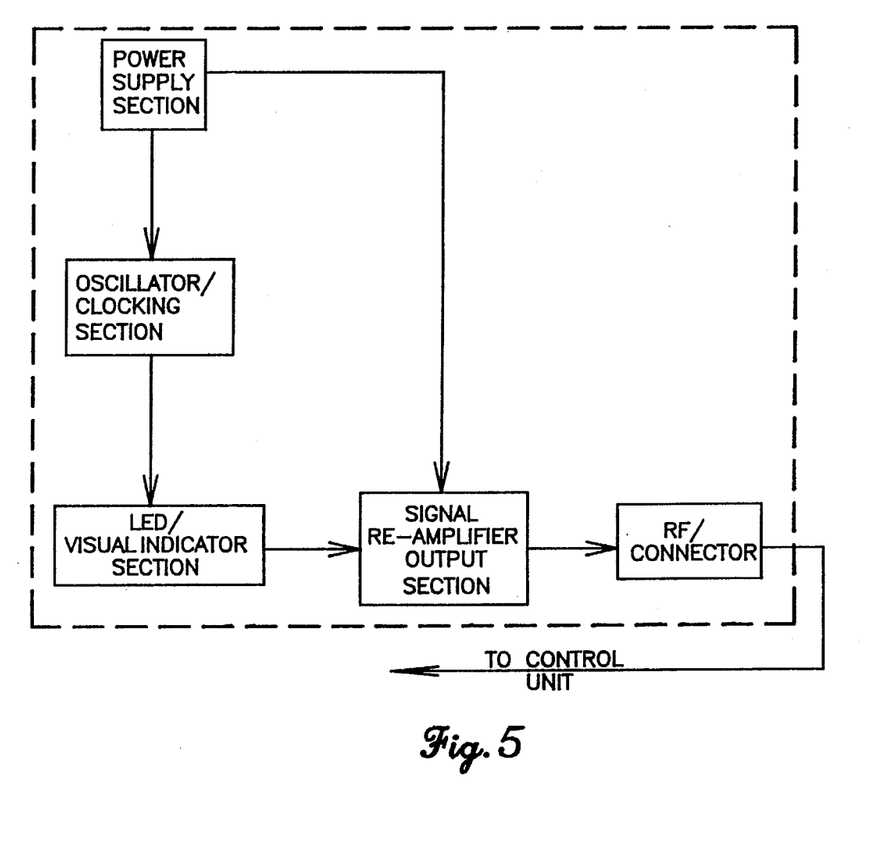
FIG. 5 is a block diagram representing an apparatus for testing an irrigation system.
Figure 6:
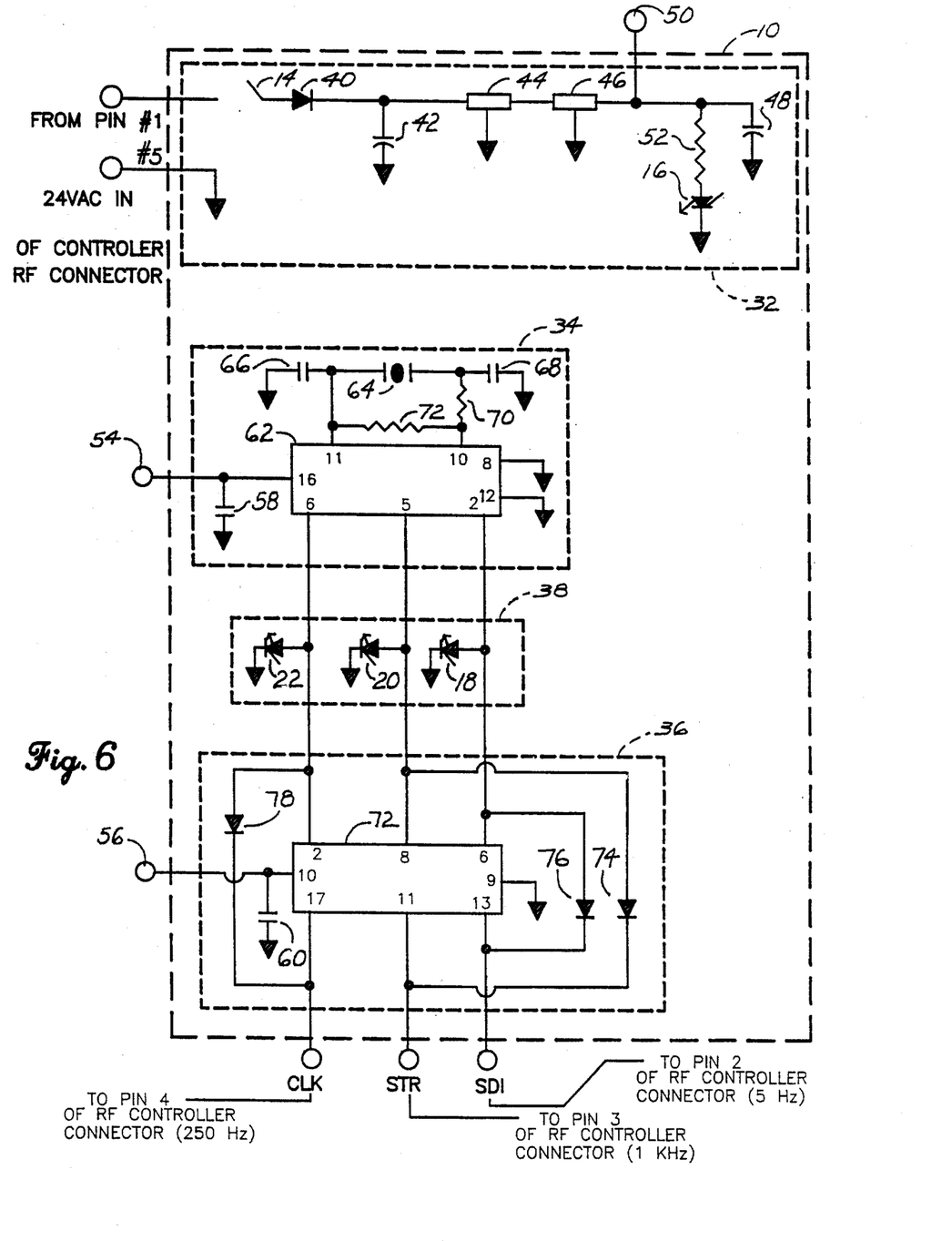
FIG. 6 is a schematic diagram representing the apparatus shown in FIG. 5.

The present invention, as shown in FIGS. 4 through 6, is an electronic tester 10 for use in testing an irrigation system 110, such as the irrigation system shown in FIG. 1. The tester 10 reduces the guess work in determining where a problem exists in the irrigation system 110. It permits defects in solenoid valves 112 and wiring 114,116, or defects in the controller 118, to be easily and quickly localized.

As shown in FIG. 1, an irrigation system 110 primarily includes the controller 118, such as an Irri-Trol Controller manufactured by Hardie Irrigation of California; a solenoid valve network comprising a plurality of solenoid valves 112; a wiring network 114 connecting the solenoid valves 112 to the controller 118; a water supply and plumbing 120 for delivering water to the solenoid valves 112.

Figure 2:
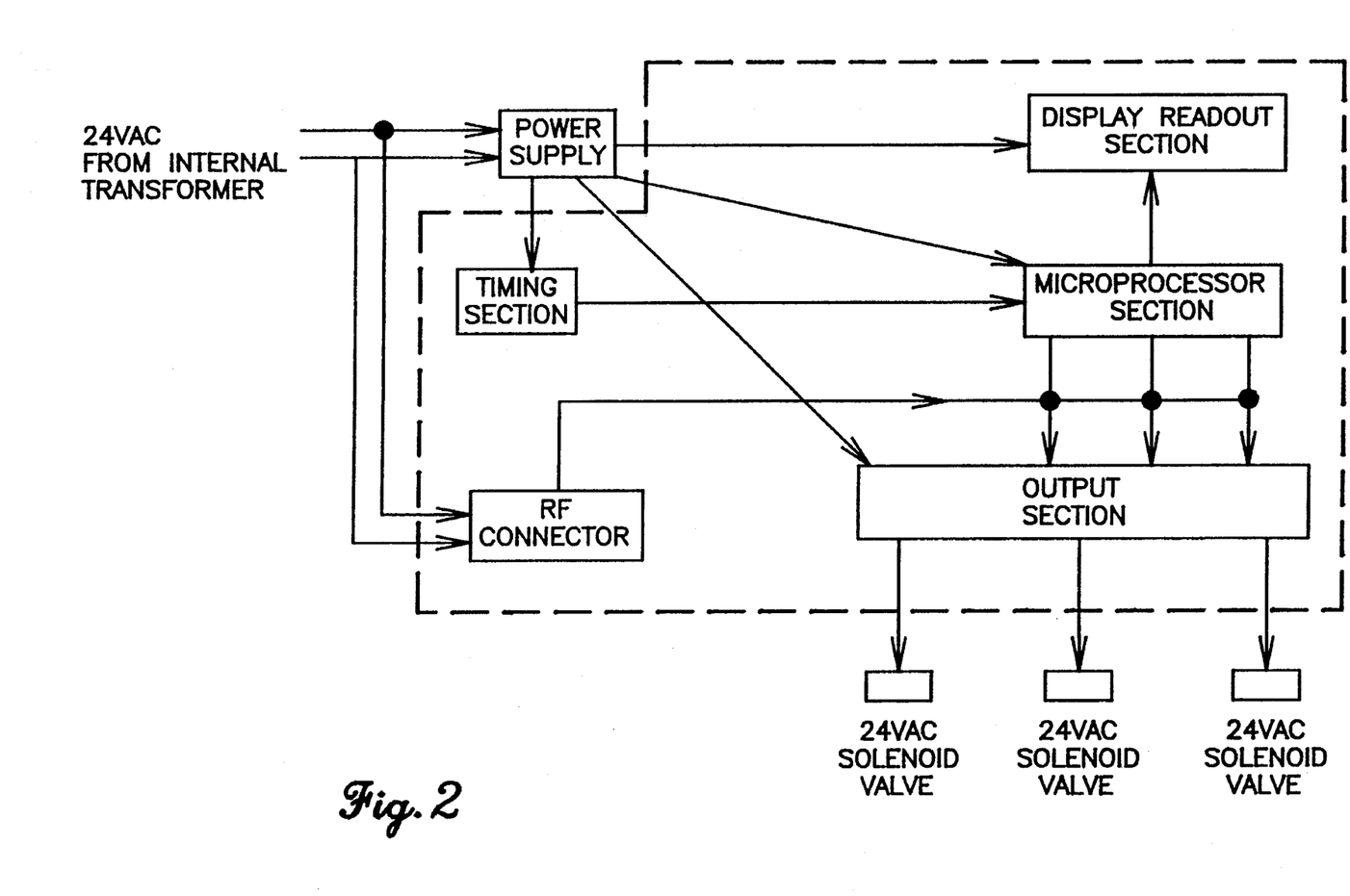
FIG. 2 is a block diagram representing an irrigation system controller and solenoid valve network.

Referring to FIG. 2, the controller 118 includes a microprocessor section 122; a timing section 124; a display readout section 126; an output section 128; and a RF connector 130. The controller 118 is operable via a 24 VAC power supply 132.

The microprocessor section 122 produces a plurality of signals for operating a plurality of solenoid valves 112. These signals are instantaneous pulses transmitted to the output section 126. The output section 126 energizes one or more of the solenoid valves 112 in response to the signals received from the microprocessor section 120.

Figure 3:
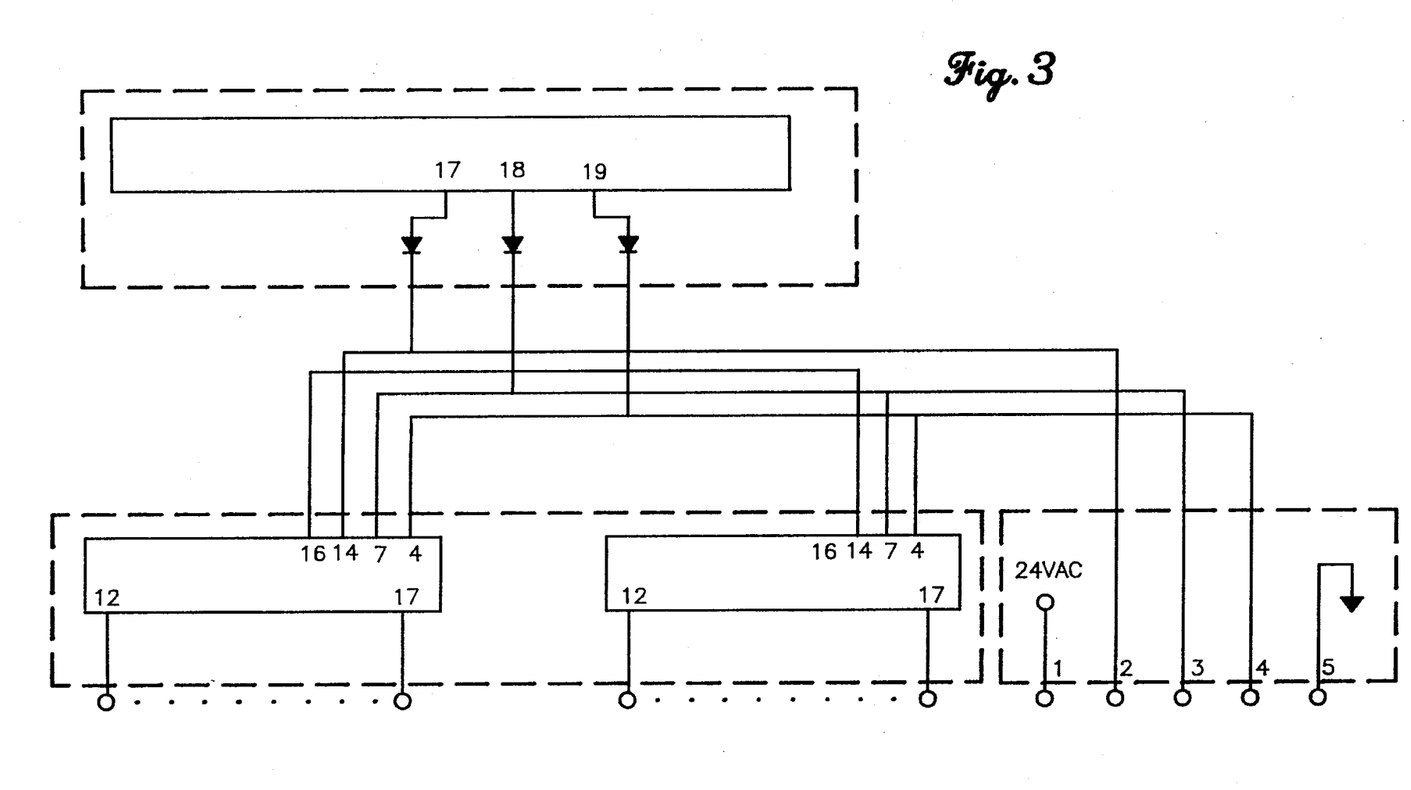
FIG. 3 is a partial schematic diagram representation of the irrigation system controller.

As shown in FIG. 3, a microprocessor 134 produces a plurality of signals which are transmitted through output chips 136, 138 to select station terminals 140. These signals may be produced either manually, or automatically by programming the controller 118. The signals are instantaneous pulses transmitted from pins 17, 18, and 19 of the microprocessor 134 through three diodes 141 and pass through output chips 136, 138 to selectively produce high and low signals at the station terminals 140, to energize and de-energize respective solenoid valves 112 (shown in FIGS. 1 and 2).

Pin 17 of the microprocessor 134 provides serial data input signal which is input through pin 14 and output through pin 16 of a first output chip 136. The signal output through pin 16 of the first output chip 136 is then input through pin 14 of a second output chip 138. Depending on the number of solenoids valves 112 being controlled, the signal may be further output through pin 16 of the second output chip 138 and subsequently processed through a series of successive output chips (not shown) similar to the first and second output chips 136, 138, each of which are capable of controlling a predetermined number of solenoid valves 112.

Pin 18 of the microprocessor 134 provides a strobe pulse parallel to pin 7 of each output chip 136, 138. Pin 19 of the microprocessor 134 provides a clocking pulse parallel to pin 4 of each output chip 136, 138. The serial data input signal is sampled and processed through the output chips 136, 138 at each strobe and clock pulse. This serial data input signal being processed by the first and second output chips 136, 138 determines the state of the signal which is present at station terminals 140. The condition of the signal present at each station terminal 140 is provided for selectively actuating and de-actuating a respective solenoid valve 112 (shown in FIGS. 1 and 2). The selection of a solenoid valve 112 is primarily dependent on the serial data input signal being transmitted from the microprocessor 134 and through the output chips 136, 138.

The tester 10 is intended to accurately and efficiently test the output chips 136, 138 for defects. Unlike the instantaneous signals provided by the microprocessor 134, the tester 10 produces a series of continuous signals. These continuous signals simulate the instantaneous signals produced by the microprocessor 134 and input through pin 14 of the first output chip 134 as well as to pins 7 and 4 of both the first and second output chips 136, 138.

The tester 10, shown in FIG. 4, includes a suitable housing 12; single-pole switch 14; a plurality of indicators 16, 18, 20, 22 such as the light emitting diodes shown; and a RF connector 24.

The tester 10 is connectable to the controller 118 (shown in FIGS. 1 and 2) via a ribbon cable 26. One end of the ribbon connector 26 includes a RF connector 28 which is matingly engageable with the remote RF connector 130 of the controller 118. An opposite end of the ribbon connector 30 includes a RF connector 28 which is matingly engageable with the RF connector 24 of the tester 10.

A first indicator 16 provides a visual indication of the status of the tester 10. A second, third, and fourth indicator 18, 20, 22 each provide a visual indicator of the condition of the output chips 136, 139 of the controller 118. The indicators 16, 18, 20, 22 may be standard light emitting diodes.

The indicators 16, 18, 20, 22 may each possess a characteristic which enables them to be easily distinguished from one another. For example, in the preferred embodiment, the first and second indicators 16, 18 are red, and the third and fourth indicators 20, 22 are green. To distinguish further between the first and second indicators 16, 18, the first indicator 16 is continuously illuminated and the second indicator 18 is intermittently illuminated.

Each of the indicators 16, 18, 20, 22 may also be positioned in discrete locations to assist in associating the intended functions therewith. For example, the indicators 16, 18, 20, 22 may be located on the face of the housing 12 as follows. The first indicator 16 may be located adjacent the switch 14 and proximate the uppermost end of the housing 12. The remaining three indicators 18, 20, 22 may be positioned below the switch 14 and the first indicator 16. The three lower indicators 18, 20, 22 may be located along a longitudinal axis A—A defined by the housing 12. The second indicator 18 may be the uppermost indicator located along the longitudinal axis A—A of the housing 12. The two lowermost indicators may be the third and fourth indicators 20, 22.

The first indicator 16 provides a visual indication of the status of the tester 10. If the switch 14 of the tester 10 is closed, the first indicator 16 illuminates to indicate that the tester 10 is activated. If the switch 14 of the tester 10 is opened, the tester 10 will be deactivated and the first indicator 16 will not be illuminated.

The remaining indicators 18, 20, 22 each provide a visual indication of the condition of the output chips 136, 138 of the controller 118. For example, an intermittent illumination of the second indicator 18 provides an indication that the output chips 136, 138 may be non-defective. If the second indicator 18 is not illuminated, a defect is present in the first output chip 136. If both of the third and fourth indicators 20, 22 are high, it is indicative that both pins 7 and 4 of each output chip 136, 138 may be non-defective. If third indicator 20 is high and the fourth indicator 22 is low, pin 7 of one or more of the output chips 136, 138 is defective. If third indicator 20 is low and the fourth indicator 22 is high, pin 4 of one or more of the output chips 136, 138 is defective. In summary, if any one of pins 4–7 or 14 of the output chips 136, 138 are low, a defect is known to be present. However, it should be noted that if pins 4–7 or 14 are high, that is, if all of the indicators 18, 20, 22 are high, and the controller 118 is not functioning properly, then signal tracing may be necessary to pinpoint the problem.

The tester 10 is dependent on the controller 118 (shown in FIGS. 1 and 2) for a 24 VAC (48 volts peak to peak) signal. As shown in FIG. 5, the tester 10 includes a power supply section 32 which regulates the 24 VAC signal to a 6 VDC signal. The 6 VDC signal drives an oscillator/clocking section 36 and a re-amplifier chip 38. The output signals from the oscillator/clocking section 36 are passed through a LED/visual indicator section 40 and the signal re-amplifier section 38. The output signal from the re-amplifier section 38 is input through the output chips 136, 138 of the controller 118. The LED/visual indicator section 40 includes the aforementioned second, third, and fourth visual indicators 18, 20, 22. As stated above, these indicators 18, 20, 22 provide an indication of a defect in the output chips 136, 138. If the output chips 136, 138 are defective low, the indicators 18, 20, 22 will fail to illuminate, indicating that the first output chip 136 is defective or that pins 4 or 7 of either of the two output chips 136, 138 are defective.

Referring back to FIG. 3, it should be noted that the three diodes 142 connected to pins 17, 18 and 19 of the microprocessor 134 prevent the signals produced by the tester 10 from passing through the microprocessor 134. These signals simulate the serial data input signal, the strobe pulse, and the clock pulse generated by the microprocessor 134 and are intended to operate the solenoid valves 112 in a manner similar to that of the microprocessor 134. These signals are transmitted to the output section 128 of the controller 118. The output section 128 energizes the solenoid valves 112 in response to the signals received by the tester 10.

An explanation of the operation of the tester 10 is given as follows with reference to FIG. 6. The power supply section 32 provides a regulated 6 VDC signal. The power supply section 32 receives a 24 VAC (48 volts peak to peak, 32 volts RMS) input signal through pins 1 and 5 of the remote control RF connector of the controller 118. The switch 14 permits the tester 10 to be controlled independent of the controller 118. Upon closing the switch 14, the 24 VAC signal entering into the power supply section 32 is rectified by a first diode 40 to produce a 32 VDC input signal. The 32 VDC input signal is filtered and stabilized by a first filtering capacitor 42, such as a 35 V, 47 uf capacitor. A first regulator 44, such as a LM7824 manufactured by Motorola, reduces the 32 VDC signal to a 24 VDC signal. A second regulator 46, such as an LM7806 also manufactured by Motorola, connected in series with the first regulator 44, reduces the 24 VDC signal to a 6 VDC output signal. The 6 VDC output signal is filtered by a second filtering capacitor 48, such as a 35 V, 47 uf capacitor, to provide a stable 6 VDC output signal at an output node 50. The 6 VDC output signal also illuminates the first indicator 16 to provide a visual indication that the switch 14 is in a closed position. A first resistor 52, such as a 680 ohm resistor, is placed in series with the first indicator 16 to limit the current flow through the first indicator 16.

The oscillator/clocking section 36 and the signal re-amplifier output section 38 each include input nodes 54, 56. These input nodes 54, 56 and the output node 50 of the power supply section 32 are common nodes. The 6 VDC input signal present at the input nodes 54, 56 of the oscillator/clocking section 36 and the signal re-amplifier output section 38 is filtered and stabilized by third and fourth filtering capacitors 58, 60, such as 1uf capacitors.

The filtered 6 VDC input signal is input through pin 6 of an oscillator chip 62, such as a CD4060, a fourteen stage oscillator manufactured by Harris. ARC time constant circuit configuration is connected to pins 10 and 11 of the oscillator chip 62 for establishing the frequency of a clock cycle. This circuit configuration includes a quartz crystal 64 which oscillates at a frequency of 32.768 KHz, and an RC filtering network comprising fifth and sixth capacitors 66, 68, such as 18 pf and 20 pf capacitors, respectively, and third and fourth resistors 70, 72, such as 20M ohm and 330K ohm resistors, respectively.

The oscillator chip 62 transmits output signals through pins 2, 5, and 6. A clock pulse is output through pin 6 of the oscillator 62; a strobe signal is output through pin 5; and a serial data input signal is output through pin 4. These signals drive the second, third, and fourth indicators 18, 20, 22, respectively. Driving these indicators 18, 20, 22 lowers the amplitude of the signal transmitted from pins 2, 5, and 6 of the oscillator chip 62.

The lower amplitude signal is fed into pins 6, 8, and 2, respectively, of an amplifier chip 72, such as a UDN6118 manufactured by Alegro, which re-amplifies the signals from pins 2, 5, and 6 of the oscillator chip 62 to a desired level of amplitude. These amplified signals are transmitted to the controller 118 through the ribbon cable 26 and the matingly engageable RF connectors 30, 24 and 28, 130.

Second third, and fourth diodes 74, 76, 78, such as standard 1N4148 diodes, provide an identification of a source of failure of the irrigation system S. If one or more of the output signals from pins 2, 5, and 6 of the oscillator chip 62 is being pulled down by an output chip 136, 138, a diode 74, 76, 78 will operate to prevent a respective indicator 18, 20, 22 from illuminating. The absence of an illuminated indicator 18, 20, 22 provides a visual indication which pinpoints a defect in an output chip 136, 138. For example, if the first output chip 136 is defective low, current will take the path of least resistance, causing the voltage across the second diode 74 to exceed the threshold voltage required to bias that diode 74, and bypass the second indicator 18 and the amplifier chip 72. If a low defect is present at pin 7 of an output chip 136, 138, that defect will produce an increase in the voltage across the third diode 76 beyond a threshold required to bias that diode 76, and bypass the third indicator 20 and the amplifier chip 72. Similarly, if a low defect is present at pin 4 of an output chip 136, 138, that defect will produce an increase in the voltage across the fourth diode 78 beyond a threshold required to bias that diode 78, and bypass the fourth indicator 22 and the amplifier chip 72.

In use, the user first disconnects the common branch element 116 of the solenoid valve wiring network 114, 116 from the common branch terminal and then connects the tester 10 to the remote control RF connector 130 of the controller 118. Upon closing the switch 14, the first indicator 16 should illuminate to indicator that the tester 10 is "on." The third and fourth indicators 20, 22 should become continuously illuminated and the second indicator 18 should continuously flash on and off. The absence of the second indicator 18 flashing is indicative that the first output chip 136 is defective. After opening the switch 14, remove the first output chip 136 and shunt pin sockets 14 and 16. Once again close the switch 14. The second indicator 18 now should flash. If the second indicator 18 still fails to flash, remove the second output chip 138 and the shunt, and replace both output chips 136, 138 with new output chips. If more than two output chips exist, repeat the aforementioned steps, removing each successive output chip, one at a time, and shunting pin sockets 14 and 16 until the second indicator 18 flashes continuously.

Once the second indicator 18 flashes continuously, proceed by checking for defects present at pins 7 and 4 of the output chips 136, 138. If a defect low is present at pins 7 and 4 of the output chips 136, 138, pins 7 and 4 will prevent their respective indicators 20, 22 from illuminating. To pinpoint the output chip possessing the defect, the user may disconnect pin 7, one output chip 136, 138 at a time, until the third indicator 20 is illuminated and pin 4, until the fourth indicator 22 is illuminated.

Once all of the defective output chips are pinpointed, it would be safe to insert new output chips in the controller 118 without risking damage to the new output chips. With the controller 118 operating properly, the testing of the irrigation system 110 is completed as follows. With the common branch element 114 of the solenoid valve wiring network 114, 116 still disconnected from the common terminal (not shown) of the controller 118, connect the common lead of an independent solenoid valve (not shown) to the common terminal in its place. Now, as the tester 10 scans through the output chips 136, 138 of the controller 118, the hot lead of the independent solenoid valve is successively placed in contact with each independent station terminal 140 to check the output signals to each solenoid valve 112. If the proper output signal is present at a station terminal 140, the independent solenoid valve will open and close to make a rapid succession of actuations evidenced by a rapid succession of "clicking" sounds. Each clicking sound represents the opening of the independent solenoid valve.

If the succession of clicking sounds are present at the station terminals 140 and a solenoid valve 112 still fails to operate, the defect can be narrowed to either the respective solenoid valve 112 associated with that station terminal 140 or to a failure in the solenoid valve wiring network 114, 116. If the independent solenoid valve "clicks" only once or does not click at all, the problem resides in a triac (not shown) in the controller 118 associated with the operation of that respective station terminal 140.

The tester 10 enables the user to test the controller 118 outputs accurately and efficiently, eliminating the need for substituting wires which may lead to false indications of malfunctions; the need for manually controlling each individual station terminal 140; the possibility of reading false voltages at the station terminals 140; and the delay time required for each station to cycle through a self-test.

The tester 10 may be used for irrigation lab service center troubleshooting or for field troubleshooting. The tester 10 allows a user to check all of the outputs of a controller 118 manually and simultaneously, eliminating the need to check each station terminal 140 and its respective solenoid valve 112 individually.

It is to be understood that the present invention is not limited to the sole embodiment described above, but encompasses any and all embodiments within the scope of the following claims.

I claim:

1. An apparatus for testing an irrigation system controller output section having serial data ports, a strobe port, and a clock pulse port, comprising:

means for simultaneously and continuously producing a plurality of control signals, said control signal producing means includes:

first, second, and third oscillator output ports, means for producing a serial data input signal at a first frequency at said first oscillator output port, means for producing a strobe signal at a second frequency at said second oscillator output port, and means for producing a clock pulse signal at a third frequency at said third oscillator output port;

means for providing a separate visual indication of each one of said control signals, said separate visual indication means being connected to said control signal producing means;

means for amplifying each one of said control signals to a desired amplitude, said amplifying means being connected to said visual indication means;

means for disabling said visual indication means and said amplifying means upon a detection of a defect in the controller output section; and means for connecting said apparatus to the controller output section.

2. The apparatus according to claim 1, further including means for rectifying and regulating a power supply.

3. The apparatus according to claim 2, further including means for actuating said apparatus and a first indicator at an output of said power supply for providing a visual indication of a presence of electric potential.

4. The apparatus according to claim 1, wherein said visual indication means include light emitting diodes.

5. The apparatus according to claim 1, wherein said connecting means includes a multi-conductor cable.

6. The apparatus according to claim 1, wherein said separate visual indication means include:

a second indicator connected to said first oscillator output port for providing a visual indication of a defect low present at the serial data input ports of the controller output section;

a third indicator connected to said second oscillator output port for providing a visual indication of a defect low present at the strobe port of the controller output section; and a fourth indicator connected to said third oscillator output port for providing a visual indication of a defect low present at the clock pulse port of the controller output section.

7. The apparatus according to claim 6, wherein said amplifying means includes:

first, second, and third amplifier input ports, said first amplifier input port being connected to said first oscillator output port, said second amplifier input port being connected to said second oscillator output port, and said third amplifier input port being connected to said third oscillator output port; and first, second, and third amplifier output ports amplifying signals from said first, second, and third input ports, respectively, said first amplifier output port being connected to the serial data input ports of the controller output section, said second amplifier output port being connected to the strobe port of the controller output section, and said third amplifier output port being connected to the clock pulse port of the controller output section.

8. The apparatus according to claim 7, wherein said disabling means includes:

first diode having a first end connected to said first oscillator output port and a second end connected to said first amplifier output port so as to enable current to pass from said first end to said second end of said first diode while preventing current from passing from said second end to said first end of said first diode;

second diode having a first end connected to said second oscillator output port and a second end connected to said second amplifier output port so as to enable current to pass from said first end to said second end of said second diode while preventing current from passing from said second end to said first end of said second diode; and third diode having a first end connected to said third oscillator output port and a second end connected to said third amplifier output port so as to enable current to pass from said first end to said second end of said third diode while preventing current from passing from said second end to said first end of said third diode.

9. The apparatus according to claim 1, further including a housing including a face, said indicators being located on said face so as to be visible; and means for actuating said apparatus, said face further supporting said actuating means.

10. An irrigation system including, in combination:

a controller output section, said controller output section having serial data ports, a strobe port, and a clock pulse port; and an apparatus for testing said controller output section, said testing apparatus comprising:

means for simultaneously and continuously producing a plurality of control signals, said control signal producing means includes:

first, second, and third oscillator output ports, means for producing a serial data input signal at a first frequency at said first oscillator output port, means for producing a strobe signal at a second frequency at said second oscillator output port, and means for producing a clock pulse signal at a third frequency at said third oscillator output port;

means for providing a separate visual indication of each one of said control signals, said separate visual indication means being connected to said control signal producing means;

means for amplifying each one of said control signals to a desired amplitude, said amplifying means being connected to said visual indication means;

means for disabling said visual indication means and said amplifying means upon a detection of a defect low in the controller output section; and means for connecting said apparatus to the controller output section.

11. The apparatus according to claim 10, further including means for rectifying and regulating a power supply.

12. The apparatus according to claim 11, further including means for actuating said apparatus and a first indicator at an output of said power supply for providing a visual indication of a presence of electric potential.

13. The apparatus according to claim 10, wherein said visual indication means include light emitting diodes.

14. The apparatus according to claim 10, wherein said separate visual indication means include:

a second indicator connected to said first oscillator output port for providing a visual indication of a defect present at the serial data input ports of the controller output section;

a third indicator connected to said second oscillator output port for providing a visual indication of a defect present at the strobe port of the controller output section; and a fourth indicator connected to said third oscillator output port for providing a visual indication of a defect present at the clock pulse port of the controller output section.

15. The apparatus according to claim 14, wherein said amplifying means includes:

first, second, and third amplifier input ports, said first amplifier input port being connected to said first oscillator output port, said second amplifier input port being connected to said second oscillator output port, and said third amplifier input port being connected to said third oscillator output port; and first, second, and third amplifier output ports amplifying signals from said first, second, and third input ports, respectively, said first amplifier output port being connected to the serial data input ports of the controller output section, said second amplifier output port being connected to the strobe port of the controller output section, and said third amplifier output port being connected to the clock pulse port of the controller output section.

16. The apparatus according to claim 15, wherein said disabling means includes:

first diode having a first end connected to said first oscillator output port and a second end connected to said first amplifier output port so as to enable current to pass from said first end to said second end of said first diode while preventing current from passing from said second end to said first end of said first diode;

second diode having a first end connected to said second oscillator output port and a second end connected to said second amplifier output port so as to enable current to pass from said first end to said second end of said second diode while preventing current from passing from said second end to said first end of said second diode; and third diode having a first end connected to said third oscillator output port and a second end connected to said third amplifier output port so as to enable current to pass from said first end to said second end of said third diode while preventing current from passing from said second end to said first end of said third diode.

* * * * *